(12) United States Patent
Shlick et al.

(10) Patent No.: US 10,481,816 B2
(45) Date of Patent: Nov. 19, 2019

(54) DYNAMICALLY ASSIGNING DATA LATCHES

(71) Applicant: Western Digital Technologies, Inc., San Jose, CA (US)

(72) Inventors: Mark Shlick, Ganey-Tikva (IL); Hadas Oshinsky, Kfar Saba (IL); Amir Shaharabany, Kochav Yair (IL); Yoav Markus, Ra'anana (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 83 days.

(21) Appl. No.: 15/787,694

(22) Filed: Oct. 18, 2017

(65) Prior Publication Data

US 2019/0114103 A1    Apr. 18, 2019

(51) Int. Cl.
*G06F 12/00* (2006.01)
*G06F 13/00* (2006.01)
*G06F 3/06* (2006.01)

(52) U.S. Cl.
CPC .......... *G06F 3/0631* (2013.01); *G06F 3/0604* (2013.01); *G06F 3/0679* (2013.01)

(58) Field of Classification Search
CPC ..... G06F 3/0631; G06F 3/0604; G06F 3/0679
USPC ....................................................... 711/103
See application file for complete search history.

(56) References Cited

U.S. PATENT DOCUMENTS

| 5,715,419 A | * | 2/1998 | Szczepanek | G06F 9/342 711/212 |
| 6,014,730 A | * | 1/2000 | Ohtsu | G06F 9/52 711/130 |
| 6,370,619 B1 | * | 4/2002 | Ho | G06F 12/121 711/129 |
| 6,577,625 B1 | * | 6/2003 | Chiou | H04L 12/413 370/352 |
| 7,802,028 B2 | * | 9/2010 | Andersen | H04L 47/2408 370/229 |
| 10,014,056 B1 | * | 7/2018 | Lee | G11C 7/22 |
| 2005/0071194 A1 | * | 3/2005 | Bormann | G06F 17/30578 705/2 |
| 2008/0059705 A1 | * | 3/2008 | Begon | G06F 12/0859 711/118 |
| 2010/0272096 A1 | * | 10/2010 | Witzel | H04L 65/1016 370/352 |

(Continued)

*Primary Examiner* — Sheng Jen Tsai
(74) *Attorney, Agent, or Firm* — Kunzler Bean & Adamson, PC

(57) ABSTRACT

Apparatus, systems, methods, and computer program products for providing dynamically assignable data latches are disclosed. A non-volatile memory die includes a non-volatile memory medium. A plurality of sets of data latches of a non-volatile memory die are configured to facilitate transmission of data to and from a non-volatile memory medium, and each of the sets of data latches are associated with a different identifier. An on-die controller is in communication with a sets of data latches. An on-die controller is configured to receive a first command for a first memory operation comprising a selected identifier. An on-die controller is configured to execute a first memory operation on a non-volatile memory medium using a set of data latches of a plurality of sets of data latches, and the set of data latches is associated with a selected identifier.

20 Claims, 12 Drawing Sheets

(56) References Cited

U.S. PATENT DOCUMENTS

| | | | |
|---|---|---|---|
| 2012/0066444 A1* | 3/2012 | Sadowski | G06F 13/1673 711/105 |
| 2012/0167100 A1* | 6/2012 | Li | G11C 16/102 718/102 |
| 2013/0094271 A1* | 4/2013 | Schuetz | G11C 5/06 365/63 |
| 2013/0114342 A1* | 5/2013 | Sakai | G11C 29/025 365/185.17 |
| 2013/0114344 A1* | 5/2013 | Sakai | G11C 11/5628 365/185.18 |
| 2013/0191831 A1* | 7/2013 | Goyal | G06F 9/46 718/100 |
| 2014/0215188 A1* | 7/2014 | Mylius | G06F 9/3836 712/208 |
| 2014/0254264 A1* | 9/2014 | Dutta | G11C 16/3459 365/185.03 |
| 2016/0246649 A1* | 8/2016 | Tsirkin | G06F 8/654 |
| 2017/0075629 A1* | 3/2017 | Manohar | G06F 3/0659 |
| 2017/0286674 A1* | 10/2017 | Gathala | G06F 3/0623 |
| 2017/0329555 A1* | 11/2017 | Decker | G06F 3/0604 |
| 2017/0351452 A1* | 12/2017 | Boyd | G06F 3/0611 |
| 2018/0074896 A1* | 3/2018 | Takada | G06F 11/1072 |
| 2018/0075917 A1* | 3/2018 | Utsunomiya | G06F 3/0619 |
| 2018/0173444 A1* | 6/2018 | Marcu | G06F 3/0626 |
| 2018/0307503 A1* | 10/2018 | Peltz | G06F 9/4418 |

\* cited by examiner

US 10,481,816 B2

DYNAMICALLY ASSIGNING DATA LATCHES

TECHNICAL FIELD

The present disclosure, in various embodiments, relates to memory devices and more particularly relates to dynamically assigning data latches of memory devices.

BACKGROUND

Controllers often utilize data latches to facilitate transmission of data between devices within a computing device when performing data operations. Conventional computing devices typically dedicate and/or assign one or more data latches to facilitate performance of a particular operation.

While dedicating/assigning one or more data latches for facilitating performance of a particular operation is useful, issues can arise when a first operation that uses multiple data latches is interrupted by a second operation that uses one or more of the same data latches and includes a higher priority than the first operation prior to completion of the first operation. In some situations, the commonly used data latch or latches may stop performing the first operation and begin performing the second operation, which can create, among other issues, latency and/or reliability issues for the first operation.

SUMMARY

Apparatuses are presented for dynamically assigning data latches. In one embodiment, an apparatus includes a non-volatile memory die including a non-volatile memory medium. An apparatus, in certain embodiments, includes a plurality of sets of data latches of a non-volatile memory die, the sets of data latches are configured to facilitate transmission of data to and from a non-volatile memory medium, and each of the sets of data latches are associated with a different identifier. An on-die controller, in a further embodiment, is in communication with a sets of data latches. An on-die controller, in one embodiment, is configured to receive a first command for a first memory operation comprising a selected identifier. In some embodiments, an on-die controller is configured to execute a first memory operation on a non-volatile memory medium using a set of data latches of a plurality of sets of data latches, and the set of data latches is associated with a selected identifier.

Systems are presented for dynamically assigning data latches. A storage device, in one embodiment, includes a device controller and a storage die in communication with the device controller. A storage die, in certain embodiments, includes a plurality of sets of data latches configured to facilitate transmission of data to and from the storage die and each of the sets of data latches is associated with a different identifier. In some embodiments, an on-die controller is in communication with sets of data latches. An on-die controller, in one embodiment, is configured to receive, from a device controller, a command for a memory operation including a selected identifier of a plurality of latch identifiers. An on-die controller, in certain embodiments, is configured to execute a memory operation on a storage die using a set of data latches of a plurality of sets of data latches associated with a selected identifier.

Another apparatus for dynamically assigning data latches is presented. In one embodiment, an apparatus includes means for associating each of a plurality of sets of data latches of a memory die with a different identifier. An apparatus, in certain embodiments, includes means for receiving, from a device controller, a command for a memory operation on a memory die, and the command comprises a selected identifier of a plurality of different latch identifiers. In some embodiments, an apparatus includes means for executing a memory operation on a memory die using a set of data latches of a plurality of sets of data latches on a memory die, the set of data latches associated with the selected identifier.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
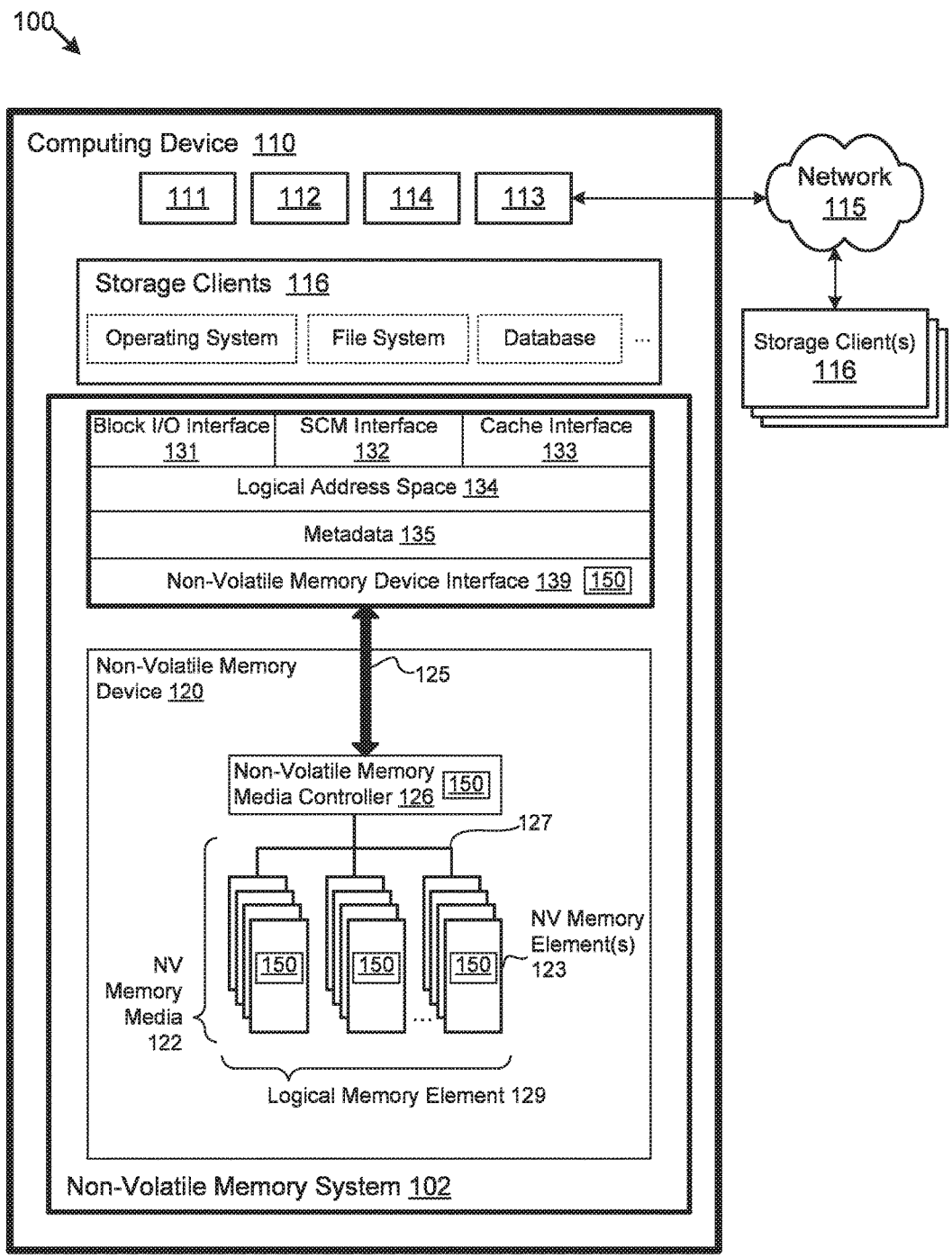
FIG. 1A is a schematic block diagram illustrating one embodiment of a system including dynamically assignable computing data latches.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a data latch assignment component 150 for a controller 126 of a non-volatile memory device 120. The data latch assignment component 150 may be part of and/or in communication with the controller 126, a non-volatile memory element 123, a device driver, or the like. The data latch assignment component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the data latch assignment component 150 may be embodied as one or more computer-readable instructions stored on the non-transitory storage medium 114.

The non-volatile memory system 102, in the depicted embodiment, includes a data latch assignment component 150. The data latch assignment component 150, in one embodiment, is configured to dynamically assign one or more data latches and/or sets of data latches for use in facilitating data operations performed by a controller (e.g., a die controller 220), as described elsewhere herein. A data latch or set of data latches can be assigned for use in facilitating data operations by assigning latch identifiers to one or more data latches or one or more sets of data latches, which latch identifiers are used by a controller (e.g., the die controller 220) to identify and/or assign the data operations to the particular data latch/latches or set(s) of data latches associated with the latch identifier(s).

In additional or alternative embodiments, a data latch or set of data latches can be assigned to facilitate data operations by modifying the latch identifier assigned to the data latch or set of data latches. For example, the data latch assignment component 150, in certain embodiments, may detect a second operation interrupting performance of a first operation. The data latch assignment component 150, in response to the interruption, may switch one or more data latches from facilitating performance of the first operation to facilitating performance of the second operation. In some embodiments, a portion of the data in the first operation may be maintained in one or more other data latches while the switched data latch/latches facilitate performance of the second operation. The data latch assignment component 150 may enable the switched data latch/latches to resume facilitating performance of the first operation in response to completion of the second operation by switching the latch identifiers of the switched data latches back to the previous latch identifier(s). Thus, the data latch assignment component 150 can dynamically assign and/or switch data latches for facilitating performance of various operations by a controller.

The data latch assignment component 150, in various embodiments, can dynamically assign a data latch to facilitate data operations by modifying a latch identifier for a particular data latch and/or assigning a new latch identifier to the particular data latch. A latch identifier can be modified, in some embodiments, by adding a prefix to the latch identifier assigned to a data latch, although other suitable modifications are possible and contemplated herein.

In one embodiment, the data latch assignment component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the data latch assignment component 150 may comprise executable software code, such as a device driver or the like, stored on the computer-readable storage medium 114 for execution on the processor 111. In a further embodiment, the data latch assignment component 150 may include a combination of both executable software code and logic hardware.

In one embodiment, the data latch assignment component 150 is configured to receive I/O requests from a device driver or other executable application via a bus 125 or the like. The data latch assignment component 150 may be further configured to transfer data to/from a device driver and/or storage clients 116 via the bus 125. Accordingly, the data latch assignment component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the data latch assignment component 150 may receive storage requests as an API call from a storage client 116, as an IO-CTL command, or the like. Of note, a data latch assignment component 150 included in the various embodiments discussed with reference to FIG. 1A may be similar to the various embodiments of a data latch assignment component 150 discussed elsewhere herein.

According to various embodiments, a controller 126 (e.g., a device controller) in communication with one or more data latch assignment components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
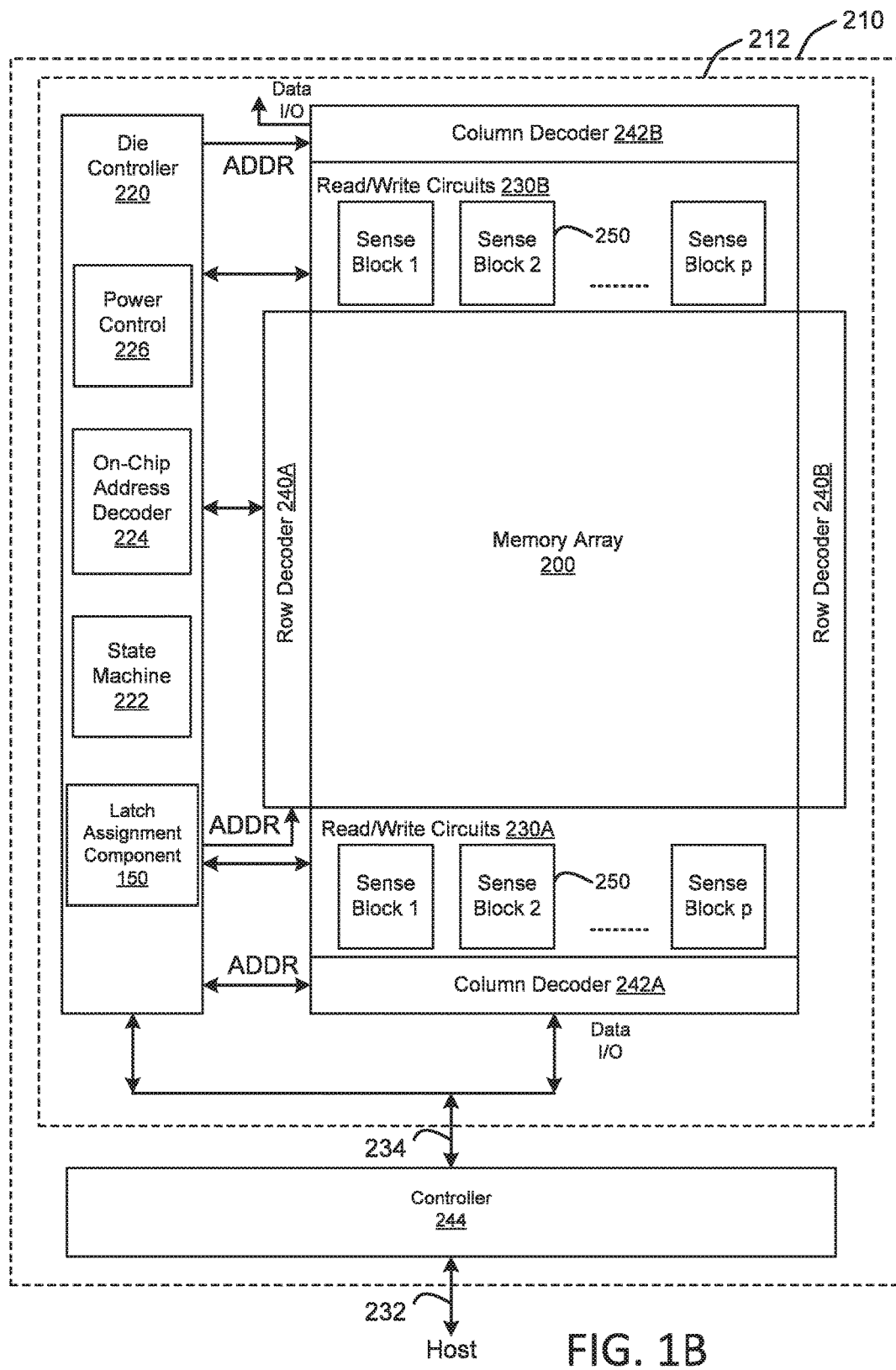
FIG. 1B is a schematic block diagram illustrating another embodiment of a system including dynamically assignable computing data latches.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a data latch assignment component 150, a state machine 222, and an on-chip address decoder 224. In one embodiment, the state machine 222 comprises at least a portion of the data latch assignment component 150. In a further embodiment, the controller 244 comprises at least a portion of the data latch assignment component 150. In various embodiments, one or more of the sense blocks 250 comprises at least a portion of the data latch assignment component 150.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the data latch assignment component 150. The data latch assignment component 150, in certain embodiments, is embodied as software in a device driver, hardware in a controller 244, and/or hardware in a die controller 220 and/or state machine 222.

In one embodiment, one or any combination of die controller 220, data latch assignment component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. A data latch assignment component 150 included in the various embodiments discussed with reference to FIG. 1B may be similar to the various embodiments of a data latch assignment component 150 discussed elsewhere herein.

Figure 2:
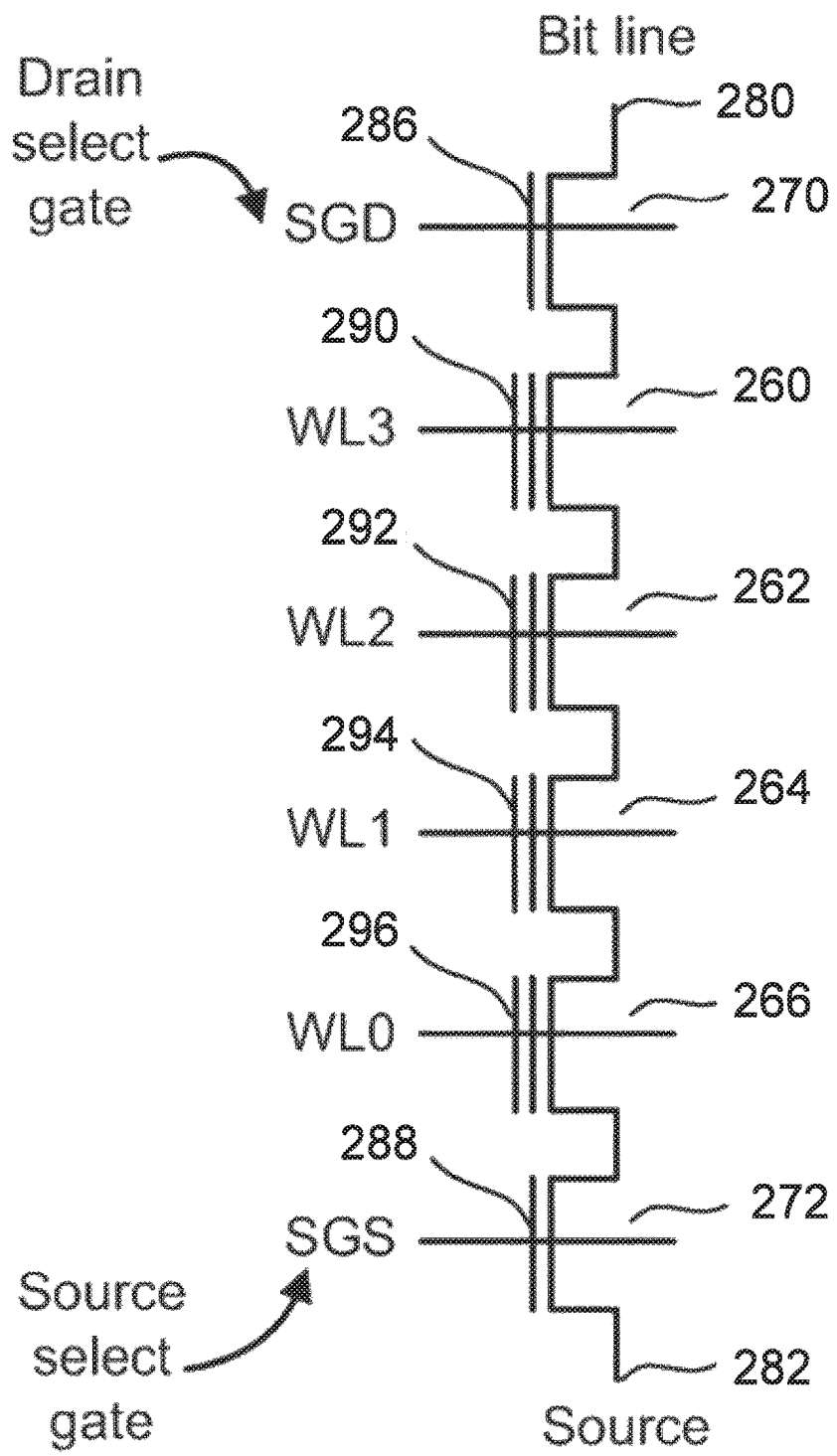
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, and 296, in one embodiment, is connected to, or comprises a portion of, a word line. In a further embodiment, a transistor 260, 262, 264, and 266 is a storage element, storage cell, or the like, also referred to as a memory cell. In some embodiments, a storage element may include multiple transistors 260, 262, 264, and 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the NAND string. The NAND string, in some embodiments, may include some storage elements 260, 262, 264, and 266 that have been programmed and some storage elements 260, 262, 264, and 266 that have not been programmed. As described in more detail below, the data latch assignment component 150 controls whether portions of a storage device, such as a NAND string, uses are used for operations.

Figure 3:
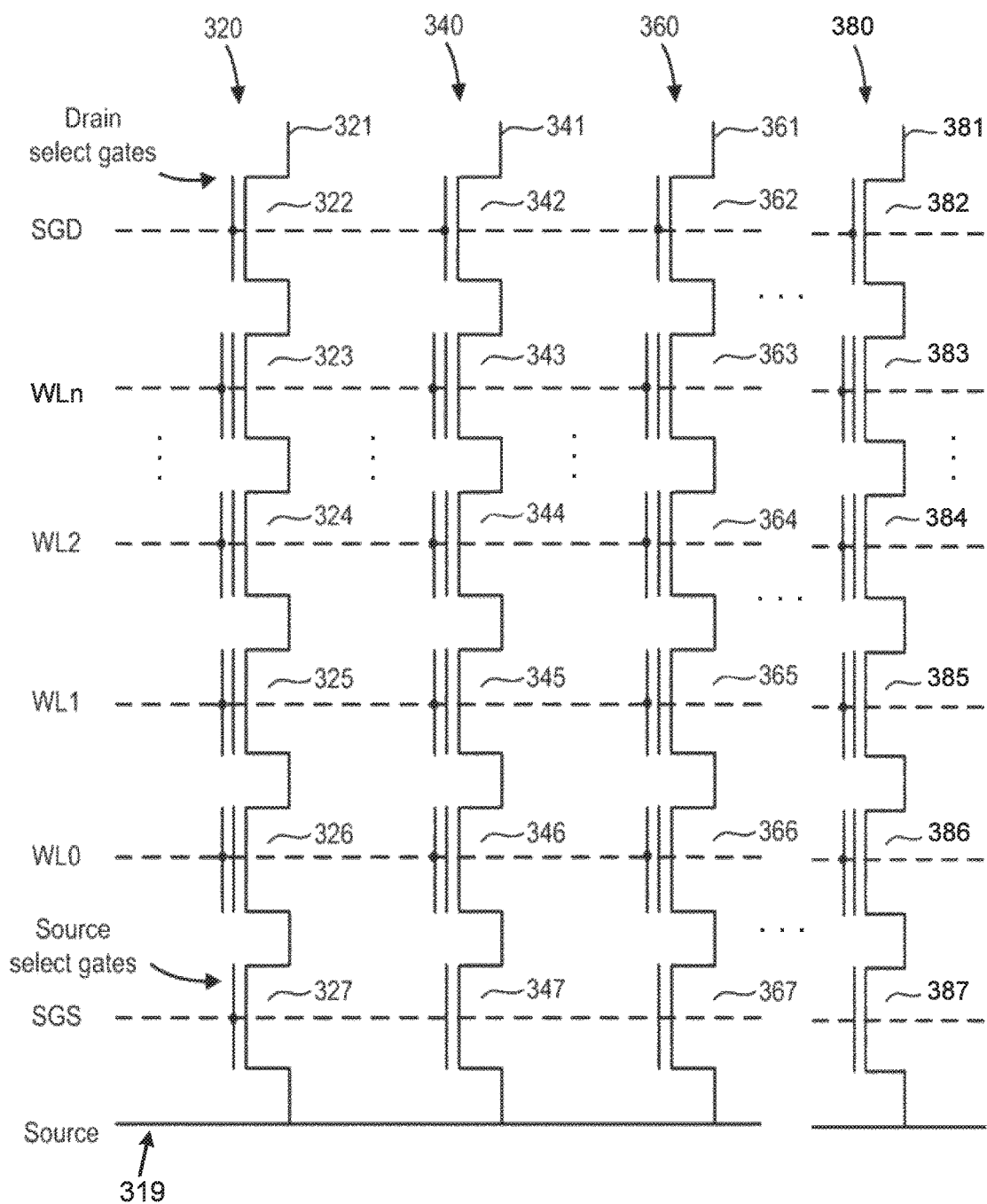
FIG. 3 is a schematic block diagram illustrating one embodiment of an array of storage cells.

FIG. 3 is a circuit diagram depicting a plurality of NAND strings 320, 340, 360, and 380. The architecture for a flash memory system using a NAND structure may include several NAND strings 320, 340, 360, and 380. For example, FIG. 3 illustrates NAND strings 320, 340, 360, and 380 in a memory array 200 that includes multiple NAND strings 320, 340, 360, and 380. In the depicted embodiment, each NAND string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per NAND string 320, 340, 360, and 380 are illustrated for simplicity, some NAND strings 320, 340, 360, and 380 can include any number of storage elements, e.g., thirty-two, sixty-four, or the like storage elements.

NAND strings 320, 340, 360, and 380, in one embodiment, are connected to a source line 319 by source select transistors 327, 347, 367, 387. A selection line SGS may be used to control the source side select transistors. The various NAND strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the NAND strings 320, 340, 360, and 380; that is, different select lines can be provided for different NAND strings 320, 340, 360, and 380.

As described above, each word line WL0-WLn comprises one or more storage elements 323-383, 324-384, 325-385, and 326-386. In the depicted embodiment, each bit line 321, 341, 361, 381 and the respective NAND string 320, 340, 360, and 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, and 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges which are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0."

When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, and 326-386 may also store multiple levels of information, for example, multiple bits of digital data. In such an embodiment, the range of VTH value is divided into the number of levels of data. For example, if four levels of information can be stored in each storage element 323-326, 343-346, 363-366, and 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

In some embodiments, portions of the storage elements 323-326, 343-346, 363-366, and 383-386 may be defective. In such an embodiment, the data latch assignment component 150 may manage which portions of the storage elements 323-326, 343-346, 363-366, and 383-386 are used for operations.

Figure 4:
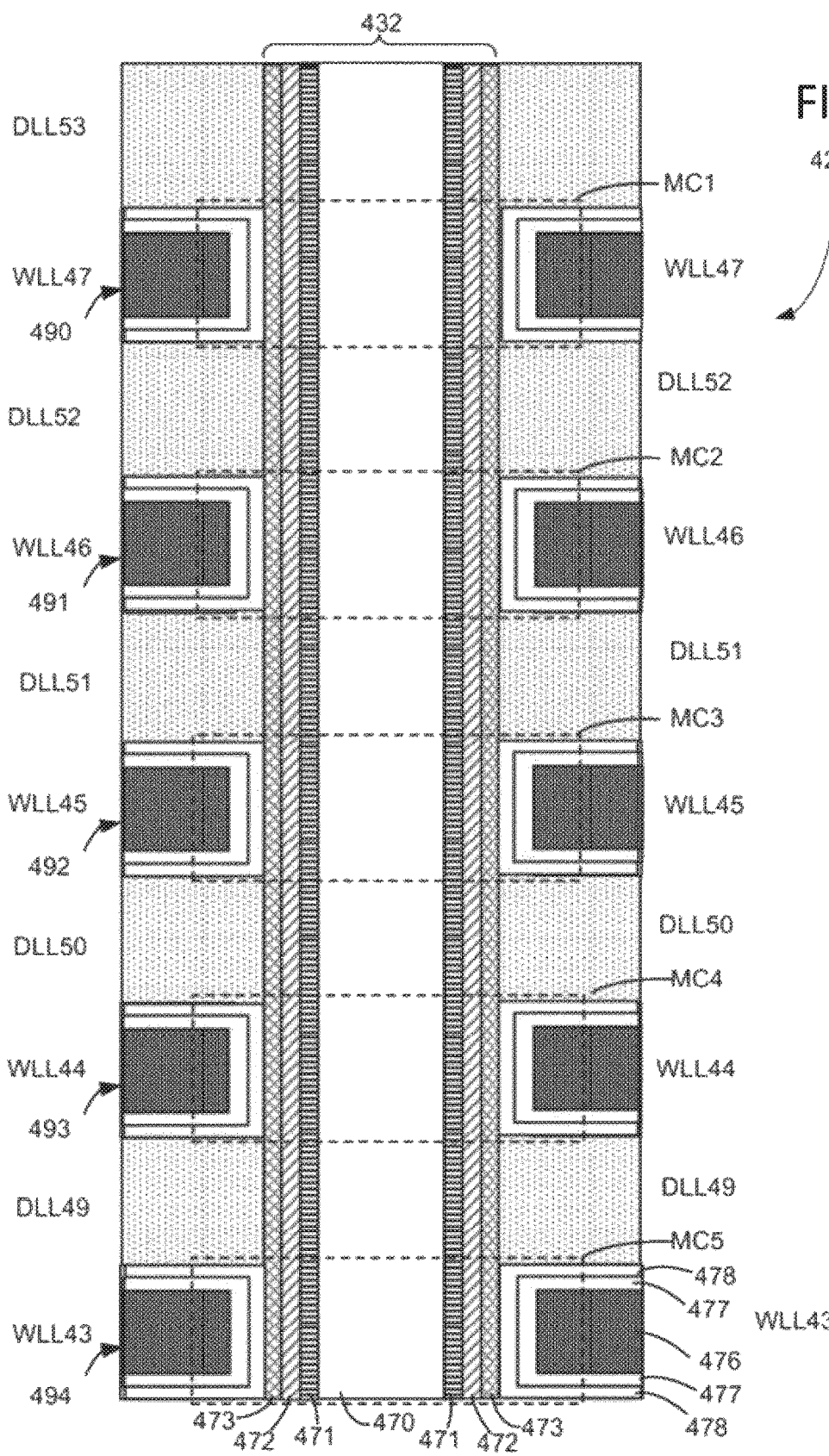
FIG. 4 is a schematic block diagram illustrating one embodiment of a three-dimensional (3-D), vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
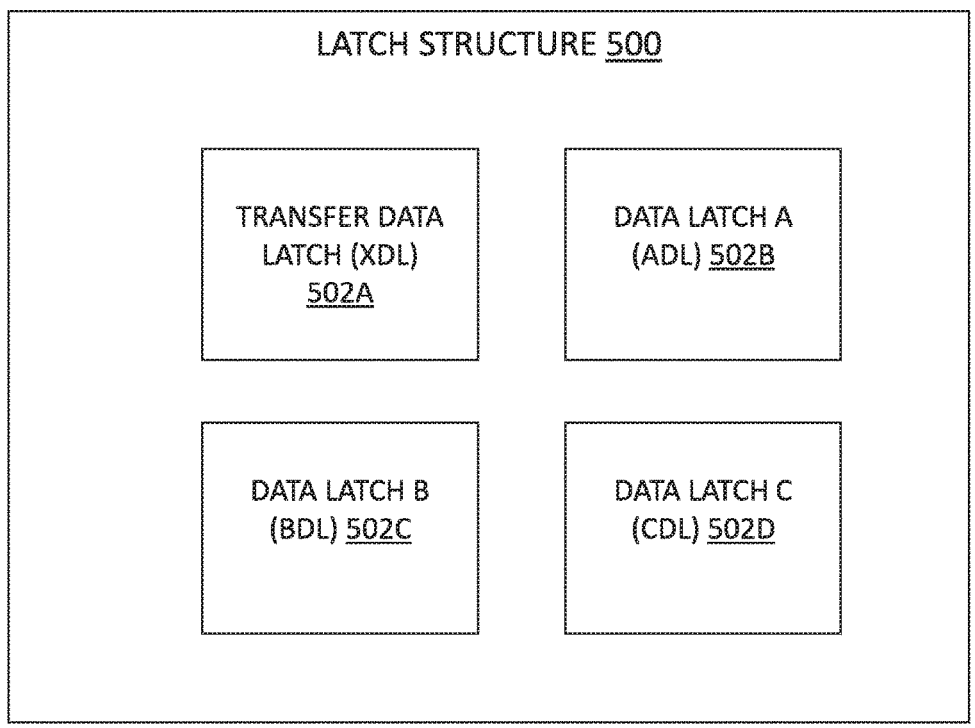
FIG. 5 is a schematic block diagram illustrating a data latch structure included in the system of FIG. 1A and/or FIG. 1B.

With reference to FIG. 5, FIG. 5 illustrates one embodiment of a data latch structure 500 including a set of data latches 502 on a memory device (e.g., the non-volatile memory device 120, the non-volatile storage device 210, or the like). A data latch 502 may include any structure that can at least temporarily store data during the performance of an I/O operation and/or memory operation by a controller (e.g., by a memory controller 126, a controller 244, and/or a die controller 220, or the like) on a memory device (e.g., the non-volatile memory device 120, the non-volatile storage device 210, the non-volatile memory element(s) 123, and/or memory array 200, or the like).

At least in the illustrated embodiment, a set of data latches 502 includes, among other components, a data latch 502A, a data latch 502B, a data latch 502C, and a data latch 502D (also simply referred to individually, in various groups, or collectively, as data latch 502 or data latches 502). In some embodiments, a data latch 502A includes a transfer data latch (also referred to as a data latch XDL or XDL 502A), a data latch 502B includes a data latch A (also referred to as a data latch ADL or ADL 502B), a data latch 502C includes a data latch B (also referred to as a data latch BDL or BDL 502C), and a data latch 502D includes a data latch C (also referred to as a data latch CDL or CDL 502D). In various embodiments, an XDL 502A stores user data, an ADL 502B stores a lower page (LP) of data, a BDL 502C stores a middle page (MP) of data, and a CDL 502D stores an upper page (UP) of data, although other configurations are possible and contemplated herein.

In some embodiments, the XDL 502A, ADL 502B, BDL 502C, and CDL 502D may be included as separate devices and/or form at least a portion of the non-volatile memory elements 123 and can provide intermediate data storage between the memory controller 126 and the NV memory media 122 (see e.g., FIG. 1A). In additional or alternative embodiments, the XDL 502A, ADL 502B, BDL 502C, and CDL 502D may be included as separate devices and/or form at least a portion of read/write circuits 230A and/or 230B and can provide intermediate data storage between the controller 244 and the memory array 200 (see e.g., FIG. 1B).

While the various embodiments discussed herein disclose the inclusion and/or use of a data latch 502, the scope of the various embodiments is/are not limited to a latch. That is, other embodiments contemplate the inclusion and/or use of other devices that can perform the function(s) of and/or functions similar to a latch. Non-limiting examples of such devices include, but are not limited to, flip-flops, registers, RAM or other volatile memory, timers, oscillators, and/or multivibrators, or the like, among other devices and/or circuits that are possible and contemplated herein.

Further, while the various embodiments illustrated in FIG. 5 include four data latches 502, the scope of the various embodiments is/are not limited to four data latches 502. That is, various other embodiments may include less than or greater than four data latches 502, each of which can be assigned a respective latch identifier.

In addition, while one set of data latches 502 is illustrated in FIG. 5, other embodiments may include more than one set of data latches 502, each of which can be assigned a respective latch identifier. Further, a set of data latches 502 may include a greater quantity or a smaller quantity of data latches 502 than the four data latches 502 illustrated in FIG. 5, each of which can be assigned a respective latch identifier.

Figure 6:
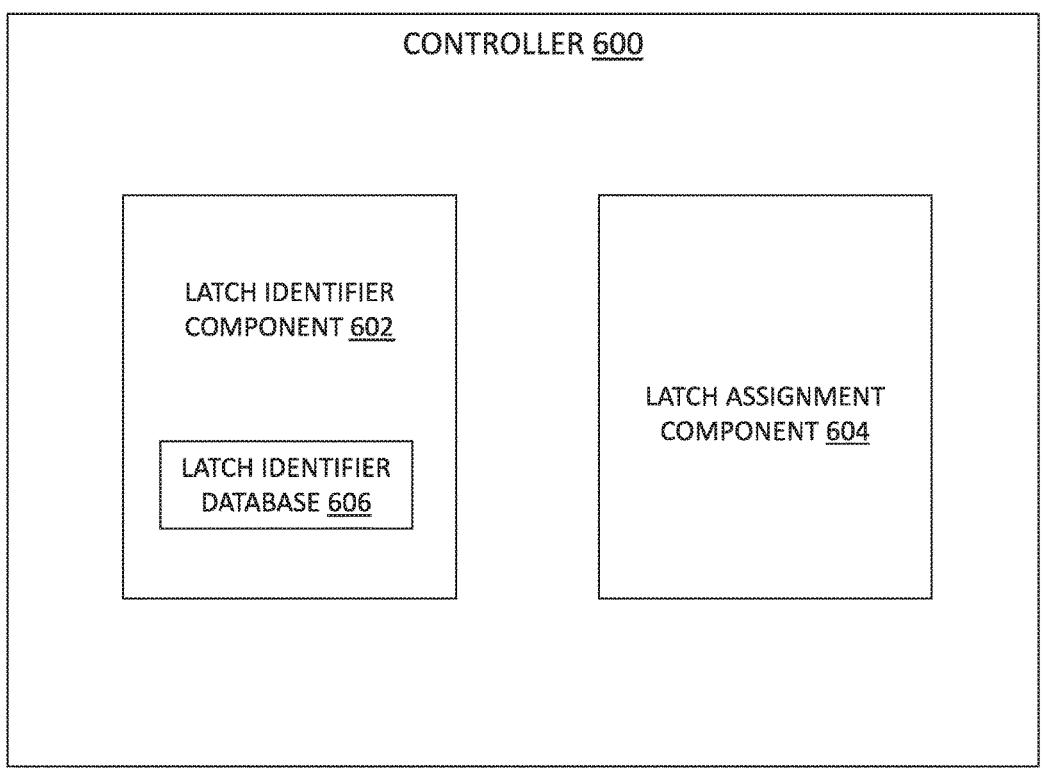
FIG. 6 is a schematic block diagram illustrating one embodiment of a controller for dynamically assigning computing data latches.

With reference to FIG. 6, FIG. 6 is a block diagram of one embodiment of a controller 600 similar to the controller 126 (e.g., see FIG. 1A) and/or the controller 244 (e.g., see FIG. 1B) discussed elsewhere herein. At least in the illustrated embodiment, a controller 600 includes, among other components, a latch identifier component 602 and a data latch assignment component 604 similar to the data latch assignment component(s) 150 discussed elsewhere herein.

A latch identifier component 602 may include any hardware and/or software than can store and/or generate a latch identifier. A latch identifier may be any type of computer-useable data that can identify and/or represent a data latch structure 500, a data latch 502, and/or set of data latches 502 (e.g., see FIG. 5). In various embodiments, a latch identifier may include a set of one or more bits, alphanumeric characters, and/or other type of identifying symbol, among other types of identifiers that are possible and contemplated herein. In various embodiments, a manufacturer, a user, and/or an industry standard may be used to assign a latch identifier to a latch structure 500, a data latch 502, and/or a set of data latches 502, among other techniques that are possible and contemplated herein.

In some embodiments, a latch identifier component 602 includes a latch identifier database 606 including a library of latch identifiers. The identifier database 606 may be organized in any suitable manner and/or using any suitable technique that is known or developed in the future including, for example, a table, chart, graph, list, and/or grouping, or the like, among other data structures for organizing data that are possible and contemplated herein.

In additional or alternative embodiments, a latch identifier component 602 can generate a latch identifier for a latch structure 500, a data latch 502, and/or a set of data latches 502. A latch identifier may be generated on the fly or may be generated and stored (e.g., in a latch identifier database 606) in advance of its use. Further, a latch identifier may be randomly generated, generated in a particular sequence and/or order, or a portion of a latch identifier may be randomly generated and another portion may be generated in a particular order/sequence.

A data latch assignment component 604 may include any suitable hardware and/or software that can assign a latch identifier to a latch structure 500, a data latch 502, and/or a set of data latches 502. For example, a data latch assignment component 604 can select an available latch identifier (e.g., a latch identifier that is not assigned to a latch structure 500, a data latch 502, and/or a set of data latches 502) in a latch identifier database 606 and assign the selected latch identifier to a latch structure 500, a data latch 502, and/or a set of data latches 502. In another non-limiting example, a data latch assignment component 604 can assign and use a latch identifier that is generated on the fly (e.g., by a latch identifier module 502) to represent the latch structure 500, a data latch 502, and/or a set of data latches 502.

A controller 600, in various embodiments, is configured to receive memory commands (e.g., input/output (I/O) commands (e.g., from one or more storage clients 116)) and execute a corresponding memory operation (e.g., I/O operation (e.g., read, write, or the like)) in response to the memory command. In some embodiments, the controller 600 is configured to select a memory element and/or memory device on which to perform the memory operation (e.g., the non-volatile memory device(s) 123 discussed with reference to FIG. 1A or the non-volatile storage device 210 discussed with reference to FIG. 1B, or the like). In selecting the memory element and/or memory device, the controller 600, by extension, can also select a latch structure 500, a data latch 502, and/or a set of data latches 502 for performing the memory operation since each memory element and/or memory device includes an associated latch structure 500, data latch 502, and/or set of data latches 502 for facilitating performance of various memory operations.

In further selecting the memory element and/or memory device, the controller 600, in various embodiments, is configured to select (e.g., via a latch identifier component 602) a latch identifier from a library of available latch identifiers (e.g., in latch identifier database 606) and/or generate a latch identifier and assign the selected/generated latch identifier (e.g., via the data latch assignment component 604) to the latch structure 500, data latch 502, and/or set of data latches 502 associated with the selected memory element and/or memory device. In this manner, the controller 600 can assign and/or dynamically assign a latch identifier to data latch structures 500, data latches 502, and/or sets of data latches 502 of a memory element and/or memory device.

Figure 7:
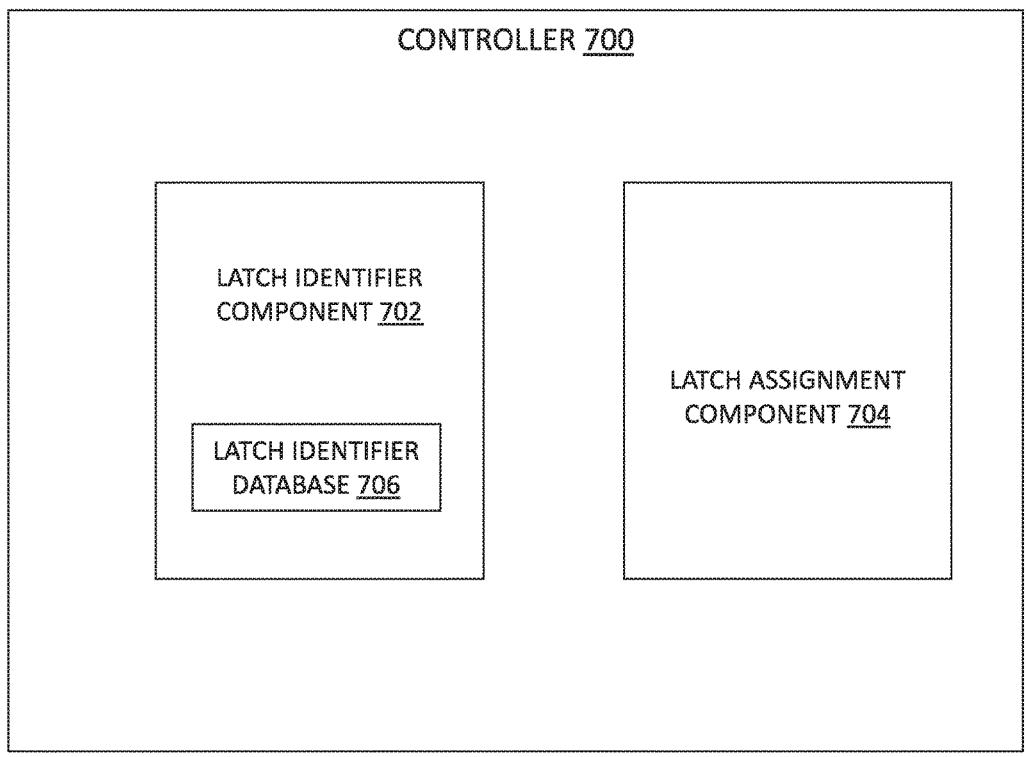
FIG. 7 is a schematic block diagram illustrating another embodiment of a controller for dynamically assigning computing data latches.

Referring to FIG. 7, FIG. 7 is a block diagram of one embodiment of a controller 700 similar to the die controller 220 discussed with reference to FIG. 1B, which can be considered an on-die controller. At least in the illustrated embodiment, a controller 700 includes, among other components, a latch identifier component 702 and a data latch assignment component 704 similar to the data latch assignment component(s) 150 discussed elsewhere herein.

A latch identifier component 702 may include any hardware and/or software than can store and/or generate a latch identifier similar to the latch identifier component 602 that can store and/or generate a latch identifier discussed elsewhere herein. In some embodiments, a latch identifier component 702 includes a latch identifier database 706 including a set of latch identifiers similar to the latch identifier component 602 discussed elsewhere herein.

In additional or alternative embodiments, a latch identifier component 702 can generate a latch identifier. A latch identifier may be generated on the fly or may be generated and stored (e.g., in a latch identifier database 706) in advance of its use. Further, a latch identifier may be randomly generated, generated in a particular sequence and/or order, or a portion of a latch identifier may be randomly generated and another portion may be generated in a particular order/sequence.

In some embodiments, a latch identifier component 702 can further generate an alternative latch identifier for a latch structure 500, a data latch 502, and/or a set of data latches 502. In some embodiments, the alternative latch identifier can switch an assigned latch identifier for a latch structure 500, a data latch 502, and/or a set of data latches 502 to an alternative latch identifier. The alternative latch identifier may be a new latch identifier (e.g., an available latch identifier in the latch identifier database 706) or may be generated on the fly and may be used to, at least temporarily, replace the assigned latch identifier in identifying and/or representing the latch structure 500, a data latch 502, and/or a set of data latches 502 associated with the latch identifier being replaced/switched.

In additional or alternative embodiments, a latch identifier component 702 generate an alternative latch identifier for a latch structure 500, a data latch 502, and/or a set of data latches 502 by modifying a latch identifier that is assigned to and/or generated for the latch structure 500, data latch 502, and/or set of data latches 502. The assigned latch identifier may be modified in any suitable manner that generates a resulting alternative latch identifier that is distinguishable from the assigned latch identifier. In some embodiments, a latch identifier component 702 can modify an assigned latch identifier by adding a prefix and/or suffix to the assigned latch identifier, among other modifications that are possible and contemplated herein, to generate the alternative latch identifier. In additional or alternative embodiments, the alternative latch identifier may be randomly generated, generated in accordance with a sequence and/or order, or a combination of thereof.

In some embodiments, a latch identifier component 702 generates an alternative latch identifier in response to a first memory operation being interrupted by a second memory operation while a data latch 502 is being used to facilitate performance ofthe first memory operation and is also assigned to facilitate performance of the second memory operation. For instance, a latch identifier component 702 can lookup and/or generate a prefix for a latch identifier associated with a data latch 502 in response to a "program" operation on the data latch 502 being interrupted by a "read" operation, a "flush" operation, or an "erase" operation for a memory device corresponding to the data latch 502, among other possible alternative latch identifiers and/or memory operations that are disclosed and/or are possible and contemplated herein.

A data latch assignment component 704 can include any suitable hardware and/or software that can assign a latch identifier, an alternative latch identifier, and/or a modified latch identifier to a latch structure 500, data latch 502, and/or a set of data latches 502. For example, a data latch assignment component 704 can select an available latch identifier (e.g., a latch identifier that is not assigned to a data latch) in a latch identifier database 706 and assign the selected latch identifier to a latch structure 500, data latch 502, and/or set of data latches 502. In another non-limiting example, a data latch assignment component 704 can assign a latch identifier that is generated on the fly (e.g., by a latch identifier component 702) and use the generated latch identifier to represent a latch structure 500, data latch 502, and/or set of data latches 502.

In additional of alternative embodiments, a data latch assignment component 704 can, at least temporarily, switch, replace, assign, and/or re-assign an alternative latch identifier to a latch structure 500, data latch 502, and/or set of data latches 502. In other words, the data latch assignment component 704 can assign a new and/or modified latch identifier to a latch structure 500, data latch 502, and/or set of data latches 502.

In some embodiments, a data latch assignment component 704 can switch, replace, assign, and/or re-assign an alternative latch identifier to a data latch 502 in response to a first memory operation being interrupted by a second memory operation while a data latch 502 is being used to facilitate performance of the first memory operation and is also assigned to facilitate performance of the second memory operation. For instance, a data latch assignment component 704 can add a prefix to a latch identifier associated with a data latch 502 in response to a "program" operation on the data latch 502 being interrupted by a "read" operation, a "flush" operation, or an "erase" operation for a memory device corresponding to the data latch 502, among other possible alternative latch identifiers and/or memory operations that are disclosed and/or are possible and contemplated herein.

In some embodiments, a latch identifier component 702 and a data latch assignment component 704 may be included in a single module and/or component. In other embodiments, a latch identifier component 702 may include at least a portion of a data latch assignment component 704 and/or a data latch assignment component 704 may include at least a portion of a latch identifier component 702.

A controller 700, in various embodiments, is configured to receive memory commands (e.g., I/O commands (e.g., from a memory controller 126, a controller 244, controller 600, or the like)) and execute corresponding memory operations (e.g., I/O operation (e.g., read, write, or the like)) on a memory element and/or memory device (e.g., memory array 200 in FIG. 1B) in response to the memory commands. A controller 700, in various embodiments, uses one or more data latches 502 to facilitate execution of the memory operations corresponding to the received memory commands.

Table 1 illustrates a set memory commands corresponding to a set of data latches 502 for facilitating performance of the memory commands.

TABLE 1

| MEMORY COMMAND | DATA LATCH | | | |
|---|---|---|---|---|
| Program TLC | XDL | ADL | BDL | CDL |
| Program SLC (Non-Cache) | XDL | | | CDL (if Program Operation Variant) |

TABLE 1-continued

| MEMORY COMMAND | | DATA LATCH | |
| --- | --- | --- | --- |
| Program SLC (Cache) | XDL | ADL | CDL (if Program Operation Variant) |
| Suspend-Resume Program SLC | XDL | | |
| Read SLC/TLC (Non-Cache) | XDL | ADL | |
| Read SLC/TLC (Cache) | XDL | ADL | |
| Suspend-Resume Read | XDL | | |
| Erase | | ADL | CDL (if Erase Operation Variant) |

For example, Table 1 illustrates that a memory command to program a triple level cell (e.g., a "program TLC" command or "program" command) uses data latches XDL, ADL, BDL, and CDL to facilitate performance of the corresponding program operations. In addition, a memory command to program an SLC with cache (e.g., a "program SLC (cache)" operation), a read SLC/TLC (non-cache) command, and a read SLC/TLC (non-cache) command uses data latches XDL and ADL to facilitate performance of the corresponding program operations. Further, a memory command to program a non-cache, single level cell (e.g., a "program SLC (non-cache)" command or "program" command), a "suspend-resume program SLC" command, and a "suspend-resume read" command uses data latch XDL to facilitate performance of the corresponding program operations. An "erase" command uses data latch ADL to facilitate performance of the corresponding erase operations. Some commands can use data latch CDL if, for example, data latch CDL uses a Program Operation Variant protocol (e.g., non-cache and/or cache program SLC commands, SmartVerify commands, or the like) and/or an Erase Operation Variant protocol is available (e.g., an erase command, and MHOPEN command, or the like).

In Table 1, a particular command can utilize one or more data latches 502 to facilitate performance of a particular operation associated with the command. As shown in Table 1, a command to "program TLC" operation may utilize all of the data latches XDL, ADL, BDL, and CDL to program a transmission line cache (TLC). Further, several other commands (e.g., Program SLC (Non-Cache), Program SLC (Cache), Read SLC/TLC (Non-Cache), Read SLC/TLC (Cache), and Erase, among other possibilities that are possible and contemplated herein) can be assigned to and/or associated with one than one of data latches XDL, ADL, BDL, and CDL to facilitate performance of their associated operation(s).

While Table 1 shows one example of the association between a set of memory commands and a set of data latches 502, the various embodiments are not limited to the associations represented in Table 1. That is, various other embodiments may include different quantities of commands, data latches 502, operations, and/or associations. Further, the various other embodiments may also include different operation-command associations and/or different command-data latch associations than those identified in Table 1. That is, the embodiment illustrated in Table 1 is not intended to limit the scope of the various embodiments discussed herein, but rather, is illustrated to assist in understanding the principles and concepts related to the various embodiments discussed herein. That is, performance of the various memory commands shown in Table 1 may correspond to and/or be facilitated by any set of the data latches 502 shown in Table 1.

Figure 8:
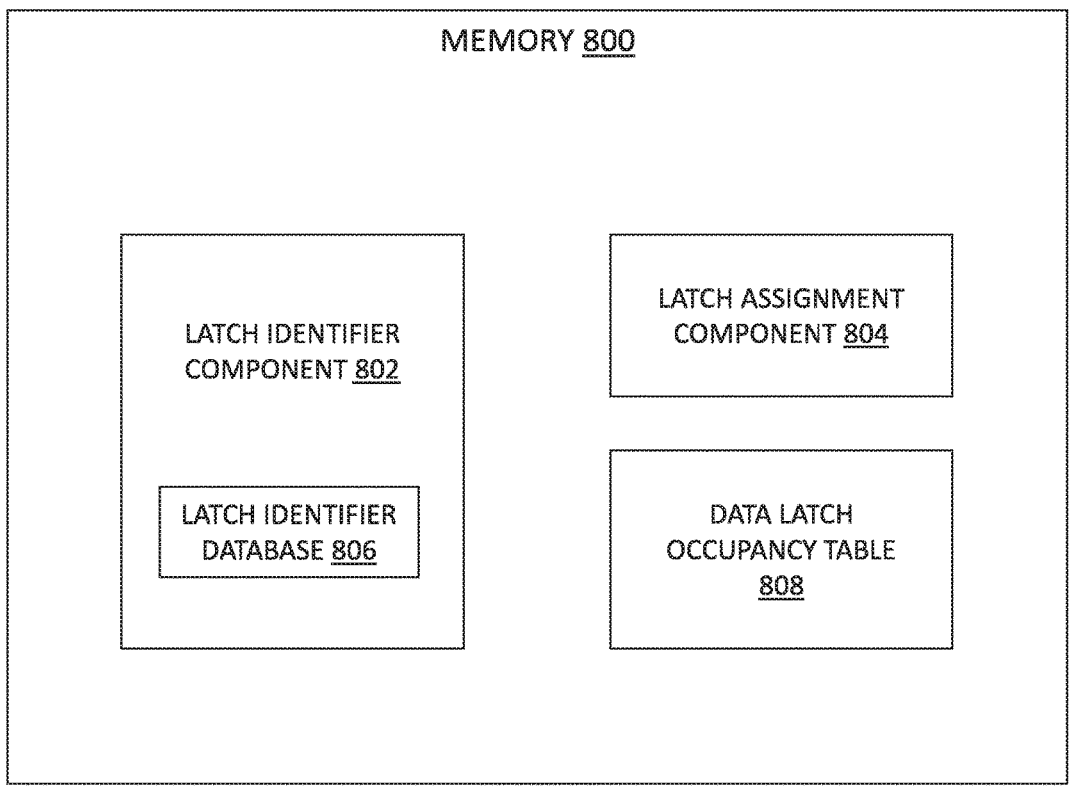
FIG. 8 is a schematic block diagram illustrating one embodiment of a memory for dynamically assigning computing data latches.

With reference to FIG. 8, FIG. 8 is a block diagram of one embodiment of a memory 800 (e.g., a memory media 122, memory element(s) 123, memory array 200, or the like). At least in the illustrated embodiment, the memory 800 includes a latch identifier module 802 similar to the, latch identifier component 602 and/or the latch identifier component 702 discussed elsewhere herein, a latch assignment component 804 similar to the latch assignment component 150, the latch assignment component 604, and/or the latch assignment component 704 discussed elsewhere herein, and a latch identifier database 806 similar to the latch identifier database 606 and/or the latch identifier database 706 discussed elsewhere herein. The illustrated embodiment of memory 800 further includes a data latch occupancy table 808.

A data latch occupancy table 808 may include any suitable type of data structure that can store data in an organized and/or pre-determined manner for referencing and/or indicating the data that is currently stored in one or more data latches 502 (e.g., data latch/latches XDL, ADL, BDL, and CDL). For example, a data latch occupancy table 808 can provide data and/or an indication of "program" data (e.g., "Program TLC" data (see Table 1)) in one or more data latches 502, among other types of indications and/or types of data that are possible and contemplated herein.

The following examples are intended to assist in understanding the various embodiments discussed herein, and not to limit the scope of the embodiments in any manner. Example 1: A controller 600 receives a memory command from a storage client 116. In response to receiving the command, the controller 600 selects a memory device for performing a memory operation associated with the memory command thereon. The controller 600 can identify a latch structure 500 and/or set of data latches 502 associated with the selected memory device. The controller 600 can select a latch identifier (e.g., a unique and/or available latch identifier) from a set of latch identifiers and assign the selected latch identifier to the latch structure 500 and/or set of data latches 502. The controller 600 can add the selected latch identifier to the memory command and transmit the memory command to the selected memory device. A controller (e.g., controller 210, controller 700, or the like) may perform a memory operation corresponding to the memory command on the selected memory device using the selected latch identifiers for the latch structure 500 and/or set of data latches 502 included in the memory command.

Example 2: A controller 700 receives a first memory command including a selected and/or assigned latch identifier for a latch structure 500 and/or set of data latches 502 selected for facilitating performance of a memory operation corresponding to the memory command. In response thereto, the controller 700 begins performing the memory operation using one or more data latches 502 in the latch structure 500 and/or set of data latches 502 with the selected and/or assigned latch identifier and corresponding to the first memory command (see e.g., Table 1). Prior to completion of the memory operation corresponding to the first memory command (e.g., a first memory operation), the controller 700 receives a second memory command that includes a higher priority than the first memory command. In response thereto, the controller 700 pauses performance of the first memory operation and generates and/or assigns an alternative latch identifier to one or more data latches 502 in the latch structure 500 and/or set of data latches 502 corresponding to facilitating performance of the memory operation corresponding to the second memory command (e.g., a second memory operation). The controller 700 performs the second memory operation using the data latch/latches 502 with the alternative latch identifier(s) corresponding to the second memory command. Upon completion of the second memory operation, the controller 700 re-assigns the assigned latch identifier to the data latch/latches 502 of the latch structure 500 and/or set of data latches 502 that were used to facilitate performance of the second memory operation. The controller 700 can then resume performing the first memory operation using the latch structure 500 and/or set of data latches 502 with the assigned latch identifier.

In Example 2, first memory operation can be a memory operation that uses two or more data latches 502 and the second memory operation can be a memory operation that uses a fewer number of data latches 502 than the first memory operation. For instance, the first memory operation can be a "program" operation that uses data latches XDL, ADL, BDL, and CDL and the second memory operation can be an operation that uses data latch XDL (e.g., a "program SLC (non-cache)" operation, a "suspend-resume program SLC" operation, and a "suspend-resume read" operation, or the like) or data latch CDL (e.g., an erase operation), among other operations that are possible and contemplated herein. In some embodiments, while a data latch 502 is being utilized to perform the second memory operation, one or more other data latches 502 in the latch structure 500 and/or set of data latches 502 can store data (e.g., "program" data) that is being used in and/or corresponding to the first memory operation while the controller 700 is performing the second memory operations. The data that is being stored in the data latch/latches 502 while the second memory operation is being performed can be tracked and/or recorded in a data latch occupancy table 808.

Further, the alternative latch identifier may include the assigned latch identifier with a prefix or a new latch identifier altogether. For instance, if the assigned latch identifier for a particular data latch 502 includes the characters "03," a prefix "53" may be added to the latch identifier to create/generate an alternative latch identifier including the characters "53" and "03" (e.g., ordered as "53-03"). The prefix can be removed to return the latch identifier to "03" for the particular data latch 502 when facilitating performance of the first memory operation.

In some embodiments, all of the data latches 502 are assigned an alternative latch identifier. In other embodiments, a portion of the data latches 502 are assigned an alternative latch identifier and another portion retain the assigned latch identifier.

Example 3: This example is similar to Example 2, except that the first memory command does not include a selected latch identifier. Here, the controller 700 assigns a selected latch identifier to the latch structure 500, the set of data latches 502, and/or to one or more data latches 502 in the latch structure 500 and/or the set of data latches 502 prior to performing the first memory operations.

Table 2 illustrates an example sequence of memory commands for a controller 600 and/or 700.

TABLE 2

| Sequence Number | Memory Command | Command Sequence | Action |
| --- | --- | --- | --- |
| 1 | Data Load for Program TLC | 01/02-80-Data-1A | ADL and BDL occupied, Receive Read request from |

TABLE 2-continued

| Sequence Number | Memory Command | Command Sequence | Action |
| --- | --- | --- | --- |
| | | | Storage Client 116 |
| 2 | Read with Cache | 53-[01/02/03/A2]-00-3C (xN) | Use CDL, ADL/BDL store program data |
| 3 | Data Load, Program TLC | 03-80-Data-15 | Program TLC |
| 4 | Data Load for Program TLC | 01/02-80-Data-1A | ADL and BDL occupied, Receive Host Flush request |
| 5 | Flush ADL/BDL to SLC | 01/02-A2-85-15 | Flush data from ADL/BDL (01/51, 02/52) |
| 6 | Flush data from Controller to SLC | 53-A2-80-Data-15 | ADL/BDL store data, Data transfer hidden (03/53) |
| 7 | Update Tables in SLC | 53-A2-80-Data-15 | ADL/BDL store data, Data transfer hidden (03/53) |
| 8 | Next Reads | 53-[01/02/03/A2]-00-3C | Read with Cache with CDL |
| 9 | Data Load, Program TLC | 03-80-Data-15 | No need to transfer to ADL and BDL |

In Table 2, data latches ADL, BDL, and CDL include the latch identifiers 01, 02, and 03, respectively, among other latch identifiers that are possible and contemplated herein. The prefix "53" is an alternative latch identifier for the CDL data latch, among other prefixes and/or alternative latch identifiers that are possible and contemplated herein. The prefixes 51 and 52 may be used for the data latches ADL and BDL, respectively, among other prefixes and/or alternative latch identifiers that are possible and contemplated herein. Further, numeral 15 is a program with cache command, 00-3C is read w/cache command, A2-80 is the start of program operation, A2-85 is the start of a flush operation, and 1A switches a page in the data load.

At sequence number 1 in Table 2, a memory command to load program TLC data is received and data latches XDL, ADL, BDL, and CDL are used to facilitate performance of the program operation until a read with cache command is received. In this example, the data latches ADL, BDL, and CDL are used in this order, although other orders and/or sequences of use are possible and contemplated herein. Further, the read command in this example is received when data latches ADL and BDL are occupied with program data and data latch CDL is still vacant. Upon receipt of the read command (at sequence number 2), the controller selects the data latch CDL for the read operation (e.g., because the data latches ADL and BDL are storing data and the CDL data is empty) by adding the prefix "53" to the command sequence for a data latch CDL so that the CDL data latch can perform the read operation while the data latches ADL and BDL each continue to store a portion of the program data (which occupancy information may be stored in a data latch occupancy table 808).

At sequence number 3, in response to completion of the read operation, the program TLC data load operation is continued by loading program data in the data latch CDL and by performing the program operation using the program data in all of the data latches ADL, BDL, and CDL. At sequence number 4, a second memory command to load program TLC data is received and data latches XDL, ADL, BDL, and CDL are used to facilitate performance of the program operation until a flush command is received. The timing of a flush command is such that the data latches ADL and BDL include the program data for the program operation, while the data latch CDL is still vacant or empty.

Upon receipt of the flush command (at sequence number 5), the data in the data latches ADL and BDL are flushed to the SLC (which occupancy information may be updated in the data latch occupancy table 808). In sequence numbers 6 and 7, data in the controller (e.g. in the RAM of the controller), including user data and management data used by the controller, is flushed to the SLC. Being able to use both data latches XDL and CDL for a programming with cache operation, a flush operation may be performed more efficiently because flash internal operations and data transfer operations can be performed in parallel.

At sequence number 8, a read with cache command selecting the data latch CDL is received. In response thereto, at sequence number 9 the data latch CDL is used for the read operation, as indicated by the "03" in the command sequence. Here, the program data in the data latches ADL and BDL have been kept intact, despite flash operations being performed in sequence numbers 5, 6, and 7, so there is no need to again transfer the program data to the data latches ADL and BDL since the program data has already been written/flushed to memory. Notably, Table 2 omits the commands for handling the CRDY/TRDY status for clarity reasons.

Figure 9:
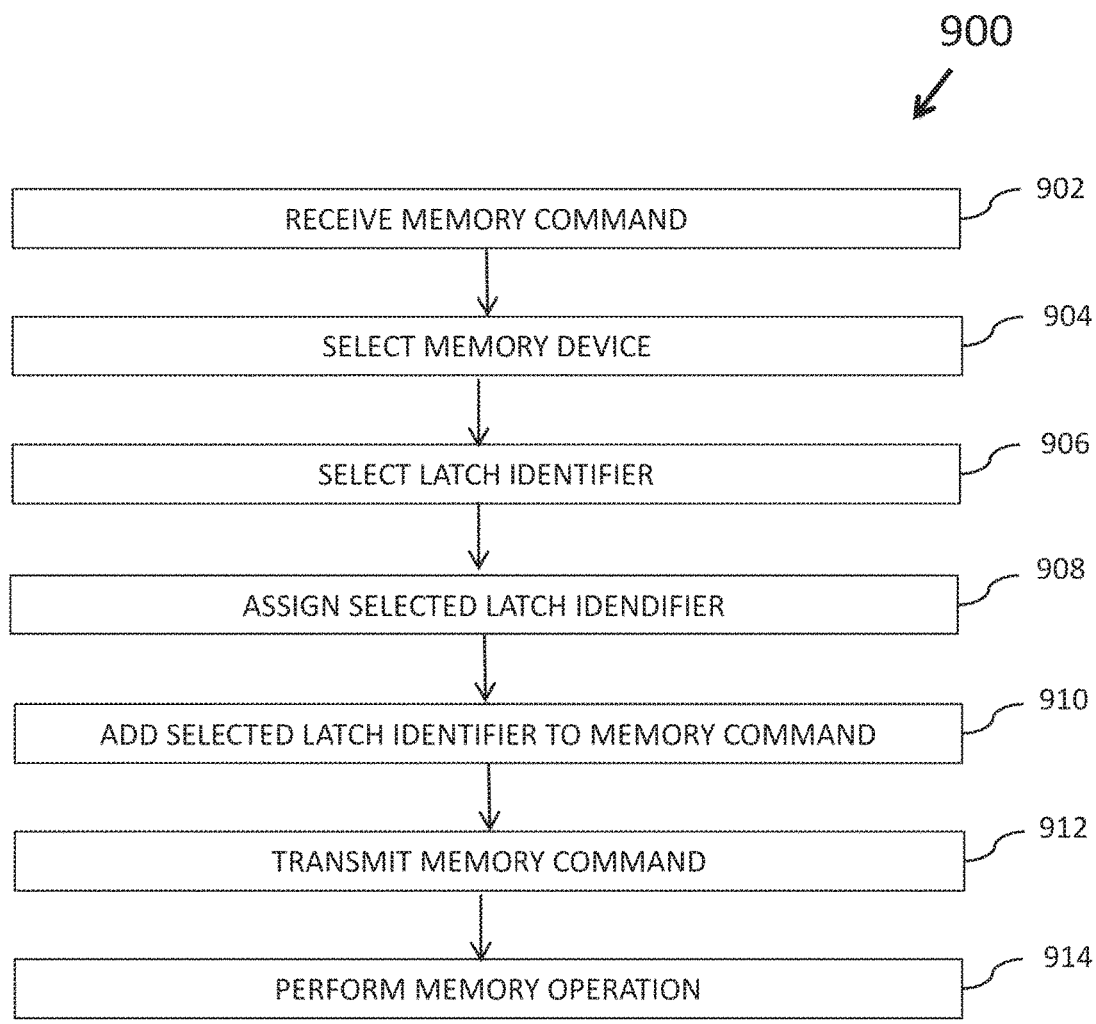
FIG. 9 is a schematic flow chart diagram illustrating one embodiment of a method for dynamically assigning computing data latches.

FIG. 9 is a schematic flow chart diagram illustrating one embodiment of a method 900 for dynamically assigning data latches. At least in the illustrated embodiment, method 900 begins by a controller 600 receiving a memory command from a storage client 116 (block 902).

In response to receiving the command, the controller 600 selects a memory device for performing a memory operation associated with the memory command thereon (block 904). The controller 600 can select a latch identifier (e.g., a unique and/or available latch identifier) from a set of latch identifiers (block 906) and assign the selected latch identifier to the latch structure 500 and/or set of data latches 502 (block 908).

The controller 600 can add the selected latch identifier to the memory command (block 910) and transmit the memory command to the selected memory device (block 912). A controller (e.g., controller 210, controller 700, or the like) may subsequently perform a memory operation corresponding to the memory command on the selected memory device using the selected latch identifiers for the latch structure 500 and/or set of data latches 502 included in the memory command (block 914).

Figure 10:
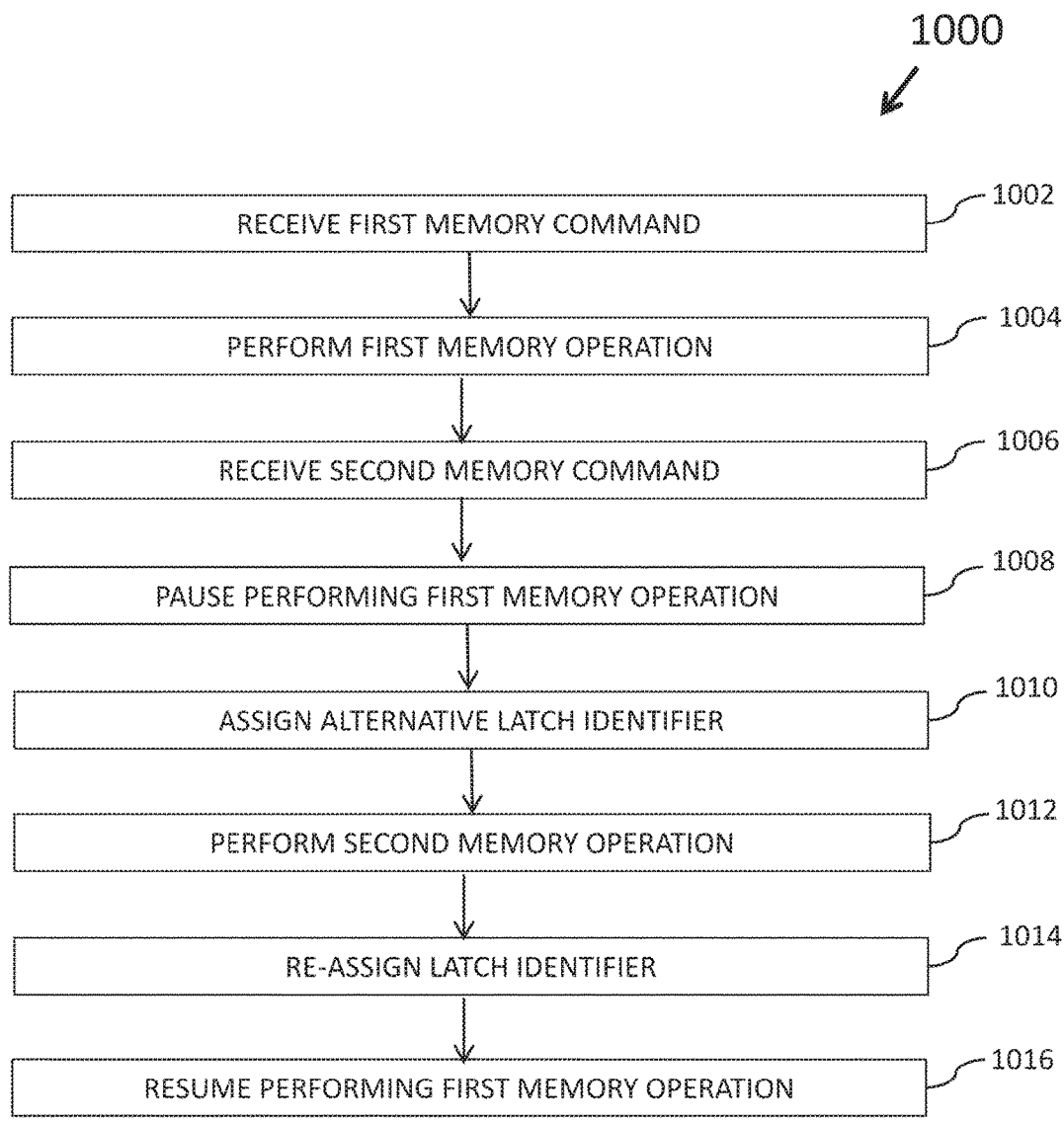
FIG. 10 is a schematic flow chart diagram illustrating another embodiment of a method for dynamically assigning computing data latches.

With reference to FIG. 10, FIG. 10 is a schematic flow chart diagram illustrating another embodiment of a method 1000 for dynamically assigning data latches. At least in the illustrated embodiment, method 1000 begins by a controller 700 receiving a first memory command including a selected and/or assigned latch identifier for a latch structure 500 and/or set of data latches 502 selected for facilitating performance of a memory operation corresponding to the first memory command (block 1002).

In response to the first memory command, the controller 700 begins performing the memory operation using one or more data latches 502 in the latch structure 500 and/or set of data latches 502 with the selected and/or assigned latch identifier and corresponding to the first memory command (block 1004). Prior to completion of the memory operation corresponding to the first memory command (e.g., a first memory operation), the controller 700 receives a second memory command that includes a higher priority than the first memory command (block 1006). In response thereto, the controller 700 pauses performance of the first memory operation (block 1008) and generates and/or assigns an alternative latch identifier to one or more data latches 502 in the latch structure 500 and/or set of data latches 502 corresponding to facilitating performance of the memory operation corresponding to the second memory command (e.g., a second memory operation) (block 1010).

The controller 700 performs the second memory operation using the data latch/latches 502 with the alternative latch identifier(s) corresponding to the second memory command (block 1012). Upon completion of the second memory operation, the controller 700 re-assigns the assigned latch identifier to the data latch/latches 502 of the latch structure 500 and/or set of data latches 502 that were used to facilitate performance of the second memory operation (block 1014). The controller 700 can then resume performing the first memory operation using the latch structure 500 and/or set of data latches 502 with the assigned latch identifier (block 1016).

Figure 11:
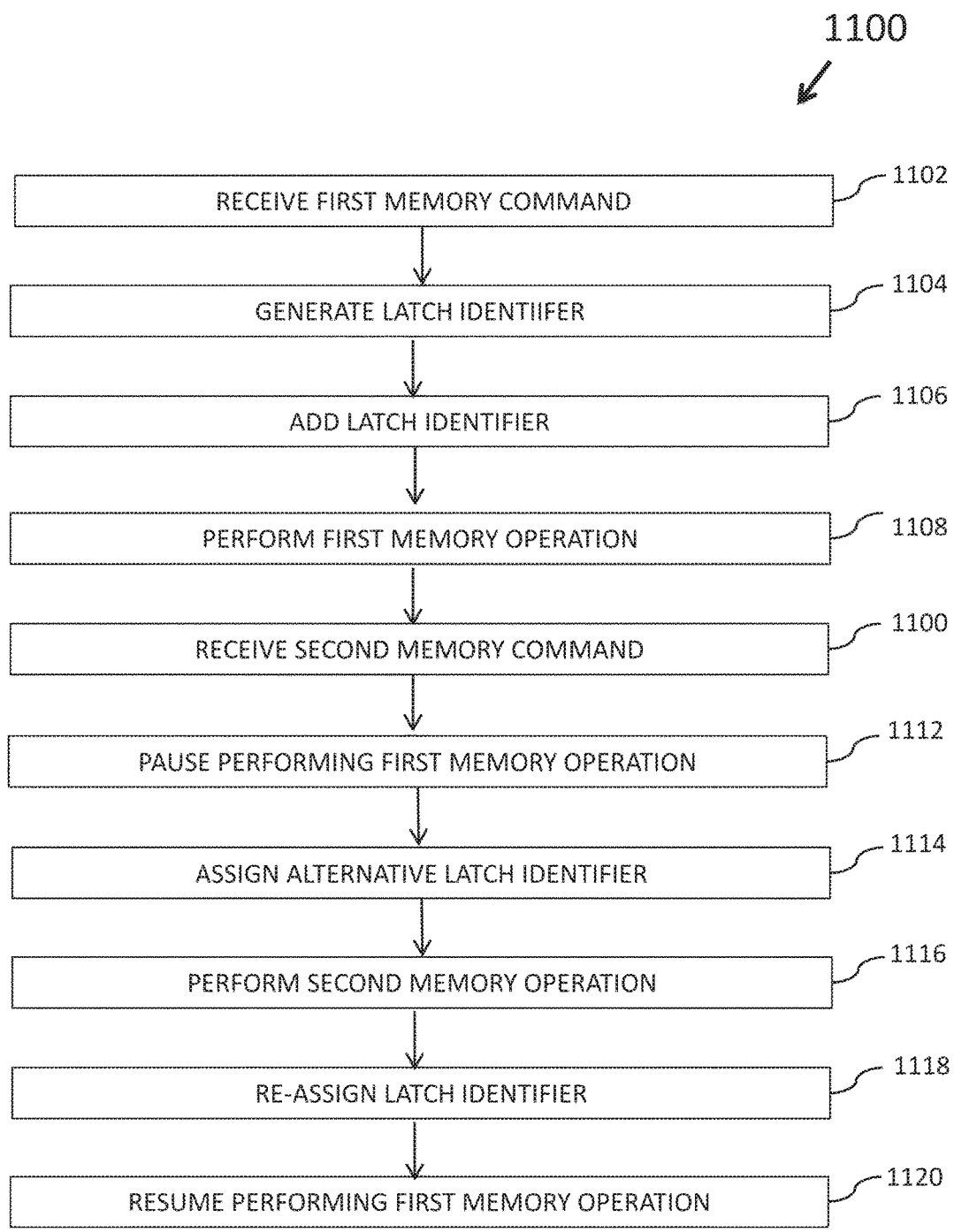
FIG. 11 is a schematic flow chart diagram illustrating yet another embodiment of a method for dynamically assigning computing data latches.

Referring to FIG. 11, FIG. 11 is a schematic flow chart diagram illustrating yet another embodiment of a method 1100 for dynamically assigning data latches. At least in the illustrated embodiment, method 1100 begins by a controller 700 receiving a first memory command (block 1102). The controller 700 generates a latch identifier for a latch structure 500 and/or set of data latches 502 selected for facilitating performance of a memory operation corresponding to the first memory command (block 1104) and adds the generated and/or an assigned latch identifier to the selected a latch structure 500 and/or set of data latches 502 (block 1106).

The controller 700 begins performing the memory operation using one or more data latches 502 in the latch structure 500 and/or set of data latches 502 with the generated and/or assigned latch identifier and corresponding to the first memory command (block 1108). Prior to completion of the memory operation corresponding to the first memory command (e.g., a first memory operation), the controller 700 receives a second memory command that includes a higher priority than the first memory command (block 1110). In response thereto, the controller 700 pauses performance of the first memory operation (block 1112) and generates and/or assigns an alternative latch identifier to one or more data latches 502 in the latch structure 500 and/or set of data latches 502 corresponding to facilitating performance of the memory operation corresponding to the second memory command (e.g., a second memory operation) (block 1114).

The controller 700 performs the second memory operation using the data latch/latches 502 with the alternative latch identifier(s) corresponding to the second memory command (block 1116). Upon completion of the second memory operation, the controller 700 re-assigns the assigned latch identifier to the data latch/latches 502 of the latch structure 500 and/or set of data latches 502 that were used to facilitate performance of the second memory operation (block 1118). The controller 700 can then resume performing the first memory operation using the latch structure 500 and/or set of data latches 502 with the assigned latch identifier (block 1120).

In the methods 1000 and/or 1100, the first memory operation can be a memory operation that uses two or more data latches 502 and the second memory operation can be a memory operation that uses a fewer number of data latches 502 than the first memory operation. For instance, the first memory operation can be a "program" operation that uses data latches XDL, ADL, BDL, and CDL and the second memory operation can be an operation that uses data latch XDL (e.g., a "program SLC (non-cache)" operation, a "suspend-resume program SLC" operation, and a "suspend-resume read" operation, or the like) or data latch CDL (e.g., an erase operation), among other operations that are possible and contemplated herein. In some embodiments, while a data latch 502 is being utilized to perform the second memory operation, one or more other data latches 502 in the latch structure 500 and/or set of data latches 502 can store data (e.g., "program" data) that is being used in and/or corresponding to the first memory operation while the controller 700 is performing the second memory operations. The data that is being stored in the data latch/latches 502 while the second memory operation is being performed can be tracked and/or recorded in a data latch occupancy table 808.

Further, the alternative latch identifier may include the assigned latch identifier with a prefix or a new latch identifier altogether. For instance, if the assigned latch identifier for a particular data latch 502 includes the characters "03," a prefix "53" may be added to the latch identifier to create/generate an alternative latch identifier including these characters ordered as, "53-[03]." The prefix can be removed to return the latch identifier to [03] for the particular data latch 502 when facilitating performance of the first memory operation.

In some embodiments, all of the data latches 502 are assigned an alternative latch identifier. In other embodiments, a portion of the data latches 502 are assigned an alternative latch identifier and another portion retain the assigned latch identifier.

A means for maintaining and/or operating a data latch assignment component (e.g., data latch assignment component 150, data latch assignment component 604, data latch assignment component 704, and/or data latch assignment component 804), in various embodiments, may include one or more of a non-volatile memory device 120, a controller 126, a non-volatile memory device interface 139, a host computing device 110, a device driver, a controller (e.g., a device driver, or the like) executing on a host computing device 110, a device controller 126, 244, an on-die controller 220, a state machine 222, a processor 111, an FPGA, an ASIC, other logic hardware, and/or other executable code stored on a computer-readable storage medium. Other embodiments may include similar or equivalent means for maintaining and/or operating a data latch assignment component 150.

Other means for maintaining and/or operating a data latch assignment component (e.g., data latch assignment component 150, data latch assignment component 604, data latch assignment component 704, and/or data latch assignment component 804), in various embodiments, may include an on-die controller 220, read/write circuit(s) 230A/230B, a controller 244 executing on a non-volatile storage device 210, other logic hardware, and/or other executable code stored on a computer-readable storage medium.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
a non-volatile memory die comprising a non-volatile memory medium;
a plurality of sets of data latches of the non-volatile memory die, the sets of data latches configured to facilitate transmission of data to and from the non-volatile memory medium, wherein each of the sets of data latches is associated with a different identifier; and
an on-die controller in communication with the sets of data latches, the on-die controller configured to:
receive a first command for a first memory operation, the first command comprising a selected identifier;
execute the first memory operation on the non-volatile memory medium using a set of latches of the plurality of sets of data latches, the set of data latches associated with the selected identifier;
receive a second command for a second memory operation while executing the first memory operation;
determine that the second memory operation uses fewer data latches than the first memory operation; and
in response to the determination:
pause execution of the first memory operation, and perform the second memory operation using a subset of data latches of the set of data latches used to execute the first memory operation.

2. The apparatus of claim 1, further comprising:
a memory controller in communication with the on-die controller, the memory controller configured to:
in response to receiving an input/output (I/O) command, selecting the non-volatile memory die for an I/O operation corresponding to the I/O command;
select an identifier of a plurality of identifiers to generate the selected identifier associated with the set of data latches; and
transmit the first command to the on-die controller.

3. The apparatus of claim 1, wherein:
the set of latches comprises a first latch including an assigned first identifier and a second latch including an assigned second identifier; and
the on-die controller is further configured to execute the first memory operation utilizing the first latch with the assigned first identifier and the second latch with the assigned second identifier.

4. The apparatus of claim 3, wherein the on-die controller is further configured to:
assign a third identifier to the first latch in response to receiving the second command; and
utilize the first latch with the third identifier to facilitate execution of the second memory operation.

5. The apparatus of claim 4, wherein the third identifier comprises a prefix added to the assigned first identifier.

6. The apparatus of claim 5, wherein, in response to receiving the second command prior to completing the first memory operation, the on-die controller is further configured to:
pause execution of the first memory operation;
execute the second memory operation using the first latch with the third identifier;
store data of the first memory operation in the second latch;
in response to completing the second memory operation, remove the prefix from the assigned first identifier to return the assigned first identifier to the first latch; and
resume executing the first memory operation using the first latch with the assigned first identifier and the second latch with the assigned second identifier.

7. The apparatus of claim 6, wherein:
the first memory operation is a "program" operation; and
the second memory operation is one of a "read" operation, a "flush" operation, and an "erase" operation.

8. The apparatus of claim 1, wherein:
the set of latches comprises a first latch and a second latch; and
the on-die controller is further configured to:
dynamically assign a first identifier of a plurality of identifiers to the first latch;
dynamically assign a second identifier of the plurality of identifiers to the second latch; and
execute the first memory operation utilizing the first latch with the dynamically assigned first identifier and the second latch with the dynamically assigned second identifier.

9. The apparatus of claim 8, wherein:
the first latch executes the second memory operation; and
the on-die controller is further configured to:
assign a third identifier in the plurality of identifiers to the first latch in response to receiving the second command; and
utilize the first latch with the third identifier to facilitate execution of the second memory operation.

10. The apparatus of claim 9, wherein the third identifier comprises one of:
the dynamically assigned first identifier and a prefix for the dynamically assigned first identifier; and
a new dynamically assigned identifier.

11. The apparatus of claim 8, wherein in response to receiving the second command prior to completing the first memory operation, the on-die controller is further configured to:
execute the second memory operation using the first latch with the third identifier;
store data of the first memory operation in the second latch;
re-assign the dynamically assigned first identifier to the first latch in response to completing the second memory operation; and
resume executing the first memory operation using the first latch with the dynamically assigned first identifier and the second latch with the dynamically assigned second identifier; and
wherein the on-die controller re-assigns the dynamically assigned first identifier by one of:
removing a prefix from the dynamically assigned first identifier; and
replacing the third identifier with the dynamically assigned first identifier.

12. The apparatus of claim 8, wherein:
the first memory operation is a "program" operation; and
the second memory operation is one of a "read" operation, a "flush" operation, and an "erase" operation.

13. The apparatus of claim 12, wherein:
each latch is assigned a latch identifier; and
the on-die controller is further configured to dynamically modify the latch identifier in response to receiving a second command from the device controller.

14. The apparatus of claim 13, wherein the on-die controller is further configured to dynamically modify the latch identifier by one of:
adding a prefix to the latch identifier; and
assigning a new latch identifier to a latch.

15. The apparatus of claim 14, wherein:
the prefix is added to the identifier; and
the on-die controller is further configured to remove the latch identifier in response to completing a second memory operation associated with the second command.

16. The apparatus of claim 14, wherein:
the new latch identifier is assigned to the latch; and
the on-die controller is further configured to replace the new latch identifier with a previous latch identifier for the latch.

17. A system, comprising:
a storage device comprising a device controller; and
a storage die in communication with the device controller, the storage die comprising:
a plurality of sets of data latches configured to facilitate transmission of data to and from the storage die, wherein each of the sets of data latches is associated with a different identifier; and
an on-die controller in communication with the sets of data latches, the on-die controller configured to:
receive, from the device controller, a first command for a first memory operation, the first command comprising a selected identifier of a plurality of latch identifiers;
execute the first memory operation on the storage die using a set of data latches of the plurality of sets of data latches, the set of data latches associated with the selected identifier;
receive a second command for a second memory operation while executing the first memory operation;
determine that the second memory operation uses fewer data latches than the first memory operation; and
in response to the determination:
pause execution of the first memory operation, and
perform the second memory operation using a subset of data latches of the set of data latches used to execute the first memory operation,
wherein the subset of data latches is associated with a different selected identifier than the selected identifier for the set of data latches.

18. The system of claim 17, wherein the device controller is configured to:
in response to receiving an input/output (I/O) command, select the storage die for an I/O operation corresponding to the I/O command;
select an identifier of a plurality of identifiers to generate the selected identifier associated with the set of data latches; and
transmit the command to the on-die controller.

19. An apparatus, comprising:
means for associating each of a plurality of sets of data latches of a memory die with a different identifier;
means for receiving, from a device controller, a first command for a first memory operation on the memory die, the first command comprising a selected identifier of the different latch identifiers;
means for executing the first memory operation on the memory die using a set of data latches of the plurality of sets of data latches on the memory die, the set of data latches associated with the selected identifier;
means for receiving a second command for a second memory operation while executing the first memory operation;
means for determining that the second memory operation uses fewer data latches than the first memory operation;

means for pausing execution of the first memory operation in response to the determination; and
means for performing the second memory operation using a subset of data latches of the set of data latches used to execute the first memory operation,
wherein the subset of data latches is associated with a different selected identifier than the selected identifier for the set of data latches.

20. The apparatus of claim 19, further comprising:
means for, in response to receiving an input/output (I/O) command, selecting the memory die for an I/O operation corresponding to the I/O command;
means for selecting an identifier of a plurality of identifiers to generate, the selected identifier associated with the set of data latches; and
means for transmitting the command to the memory die.

* * * * *